(12) United States Patent
Wong (10) Patent No.: US 9,258,467 B2
(45) Date of Patent: Feb. 9, 2016

(54) CAMERA MODULE (71) Applicant: STMicroelectronics Pte Ltd., Singapore (SG)

(72) Inventor: Wing Shenq Wong, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 115 days.

(21) Appl. No.: 14/084,410

(22) Filed: Nov. 19, 2013

(65) Prior Publication Data
US 2015/0138436 A1 May 21, 2015

(51) Int. Cl.
*H04N 3/14* (2006.01)
*H04N 5/335* (2011.01)
*H04N 5/225* (2006.01)
*H01L 27/146* (2006.01)
*B29L 31/00* (2006.01)

(52) U.S. Cl.
CPC ........ *H04N 5/2253* (2013.01); *H01L 27/14618* (2013.01); *H01L 27/14683* (2013.01); *H04N 5/2257* (2013.01); *B29L 2031/764* (2013.01)

(58) Field of Classification Search
CPC ........... H01L 2224/73265; H01L 2224/48227; H04N 5/2254; H04N 5/2253; H04N 5/2257; H04N 5/2252; G02B 7/025
USPC .................... 348/294, 374; 257/432; 359/819
See application file for complete search history.

(56) References Cited

U.S. PATENT DOCUMENTS

| | | | | |
|---|---|---|---|---|
| 4,714,333 A * | 12/1987 | Tamamura et al. | ............. | 396/29 |
| 5,436,492 A * | 7/1995 | Yamanaka | .................... | 257/433 |
| 5,781,351 A * | 7/1998 | Murakami et al. | ............ | 359/808 |
| 2002/0145676 A1* | 10/2002 | Kuno et al. | .................... | 348/340 |
| 2005/0082490 A1* | 4/2005 | Perillat | .................... | 250/370.09 |
| 2005/0169620 A1* | 8/2005 | Minamio et al. | ................. | 396/71 |
| 2005/0185088 A1* | 8/2005 | Kale et al. | ...................... | 348/374 |
| 2007/0206455 A1* | 9/2007 | Minamio et al. | ........... | 369/44.27 |
| 2007/0236596 A1* | 10/2007 | Sekine et al. | ................. | 348/340 |
| 2008/0024883 A1* | 1/2008 | Iwasaki | ......................... | 359/808 |
| 2008/0151396 A1* | 6/2008 | Chiang | .......................... | 359/823 |
| 2008/0246866 A1* | 10/2008 | Kinoshita | ..................... | 348/294 |
| 2009/0050994 A1* | 2/2009 | Ishihara et al. | ............... | 257/432 |
| 2009/0102959 A1* | 4/2009 | Chen et al. | ..................... | 348/340 |
| 2009/0231688 A1* | 9/2009 | Shyu | ...................... G02B 7/025 359/362 |
| 2010/0053394 A1* | 3/2010 | Kinoshita | ..................... | 348/294 |
| 2010/0141745 A1* | 6/2010 | Lin | ................................. | 348/68 |
| 2010/0142061 A1* | 6/2010 | Choi | ..................... B29C 33/305 359/793 |
| 2010/0142066 A1* | 6/2010 | Okabe | ...................... G02B 7/08 359/824 |
| 2010/0157137 A1* | 6/2010 | Imai | ........................ G02B 7/02 348/362 |
| 2011/0043687 A1* | 2/2011 | Chang | .......................... | 348/374 |

(Continued)

*Primary Examiner* — Chia-Wei A Chen
(74) *Attorney, Agent, or Firm* — Seed IP Law Group PLLC (57) ABSTRACT

One or more embodiments are directed to optical module assemblies, such as a camera module assembly, and methods of forming same. One embodiment is directed to an optical module assembly that includes a substrate having a first surface. An optical device is secured to the first surface of the substrate and electrically coupled to the substrate. A molded body is located on the first surface of the substrate outward of the optical device. The molded body includes a first recess. A lens assembly is secured to the molded body over the first recess by an adhesive material located in the first recess. In some embodiments, the molded body of the optical module assembly further includes a second recess spaced apart from the first recess. A transparent material is secured to the molded body over the second recess by an adhesive material located in the second recess.

22 Claims, 8 Drawing Sheets

(56) References Cited

U.S. PATENT DOCUMENTS

| | | | |
|---|---|---|---|
| 2011/0063739 A1* | 3/2011 | Hirata et al. | 359/819 |
| 2011/0096213 A1* | 4/2011 | Hasegawa | 348/294 |
| 2011/0108308 A1* | 5/2011 | Kamada | 174/255 |
| 2011/0109791 A1* | 5/2011 | Obara et al. | 348/374 |
| 2013/0037833 A1* | 2/2013 | Nam et al. | 257/88 |
| 2014/0168796 A1* | 6/2014 | Mori et al. | 359/819 |
| 2015/0064447 A1* | 3/2015 | Dewa et al. | 428/331 |
| 2015/0083192 A1* | 3/2015 | Nobori | 136/246 |

* cited by examiner

CAMERA MODULE

BACKGROUND

1. Technical Field

Embodiments of the present disclosure are directed to optical devices that include camera module assemblies.

2. Description of the Related Art

Camera module assemblies are used in various applications for capturing still images and videos. Such applications include smartphones, tablets, and cameras, which in general, have a consistent market demand for small and compact devices. In that regard, manufacturers are pressured to produce smaller electronic assemblies that are used in the various electronic devices.

Generally described, camera module assemblies include a lens assembly located over an image sensor that may be attached to a substrate. Typically, the lens assembly is also attached to a surface of the substrate using a curing process, such as an ultraviolet (UV) light curing process. During the lens assembly attachment process, an air vent through the lens assembly allows air to escape. The air vent prevents a lens element within the lens assembly from tilting, which can be caused by high pressure created during the curing process. Unfortunately, however, the air vent may also create an opening into a cavity that includes the image sensor, thereby exposing the image sensor to foreign material that can affect the reliability of the image sensor.

BRIEF SUMMARY

One or more embodiments are directed to optical module assemblies, such as a camera module assembly, and methods of forming same. One embodiment is directed to an optical module assembly that includes a substrate having a first surface. An optical device, such as an image sensor, is secured to the first surface of the substrate and electrically coupled to the substrate. A molded body is located on the first surface of the substrate outward of the optical device. The molded body includes a first recess. A lens assembly is secured to the molded body over the first recess by an adhesive material located in the first recess. In some embodiments, the molded body of the optical module assembly further includes a second recess spaced apart from the first recess. A transparent material is secured to the molded body over the second recess by an adhesive material located in the second recess. The transparent material may be located between the first surface of the substrate and the lens assembly. In another embodiment, the transparent material is secured to a surface of the lens assembly. The surface of the lens assembly may be facing the first surface of the substrate.

DETAILED DESCRIPTION

One or more embodiments are directed to optical module assemblies, such as camera module assemblies and methods of forming same. In one embodiment, the camera module assembly includes an optical device, such as an image sensor, on a first surface of a substrate and a lens assembly located above the optical device. As will be explained below, the camera module assembly has a first sealed chamber in which the image sensor is located and a second chamber formed in part by the lens assembly. The second chamber is fluidly isolated from the first chamber. The second chamber includes an air path for venting air during the lens assembly attachment process. By fluidly isolated the first chamber from the second chamber, the image sensor is protected from foreign objects that may enter into the second chamber through the air path.

Figure 1:
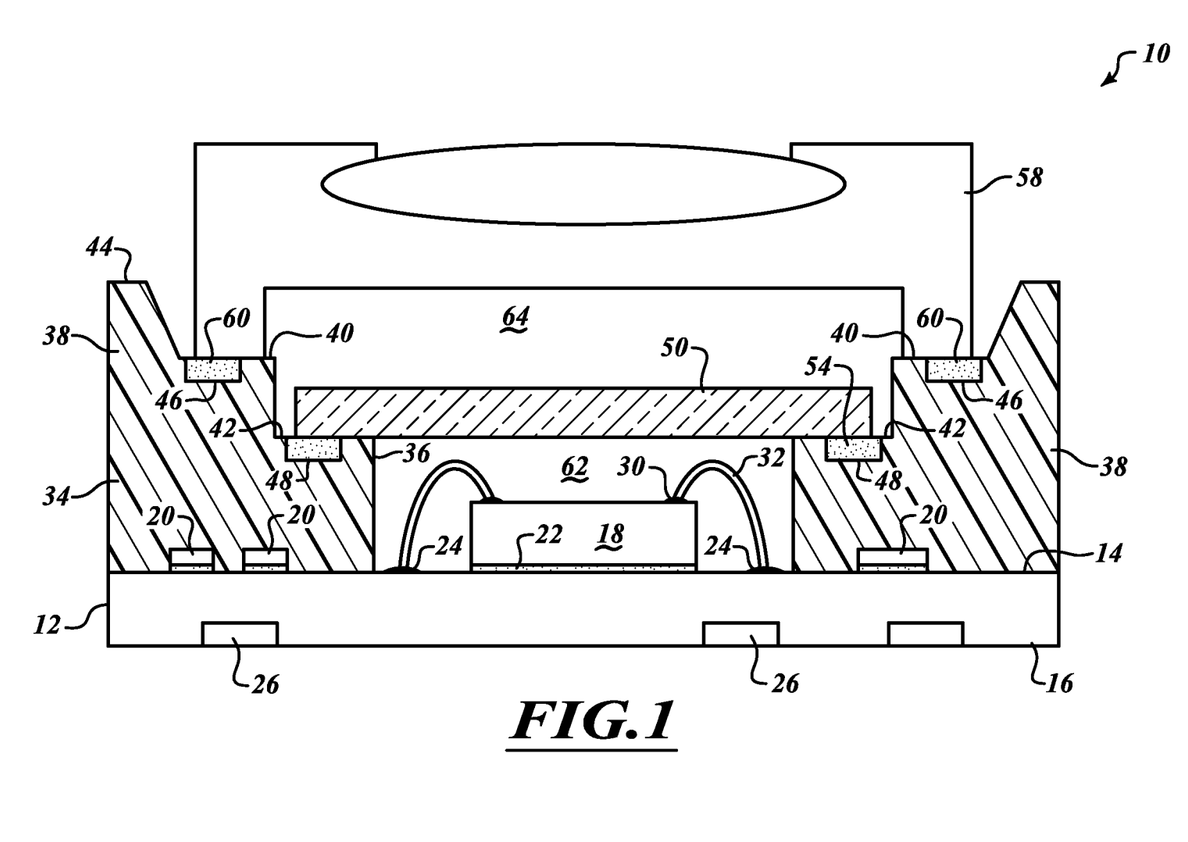
FIG. 1 is a cross-section view of a camera module assembly according to one embodiment of the invention.

FIG. 1 shows a camera module assembly 10 according to one embodiment. The camera module assembly 10 includes a substrate 12 having a first surface 14 and a second surface 16. An optical device, such as an image sensor 18, and surface mount devices 20, such as passive or active components, are located on the first surface 14 of the substrate 12. The image sensor 18 includes a back surface secured to the first surface 14 of the substrate 12 and an upper surface. The image sensor 18 includes structure for receiving light and for converting the received light into electrical signals as is well known in the art.

The image sensor 18 and the surface mount devices 20 are secured to the first surface 14 of the substrate 12 by an adhesive material 22. The adhesive material 22 may be any adhesive configured to secure the components to the substrate 12, such as tape, glue, tape, curable adhesive, or any other suitable adhesive. In one embodiment, the adhesive material 22 used to secure the image sensor 18 to the substrate 12 is different from the adhesive material used to secure the surface mount devices 20 to the substrate 12.

Generally described, the substrate 12 includes one or more conductive and insulative layers. The first surface 14 of the substrate 12 includes pads 24 and the second surface 16 of the substrate 12 includes lands 26. The pads 24 on the first surface 14 of the substrate 12 are in electrical communication with one or more lands 26 on the second surface 16 by conductive traces and/or vias formed in the substrate 12. The second surface 16 of the first substrate 12 forms an outer surface of the camera module assembly 10. The lands 26 on the second surface 16 are for electrically coupling the camera module assembly 10 to another device or board (not shown).

The upper surface of the image sensor 18 includes pads 30. The pads 30 of the image sensor 18 are placed in electrical communication with one or more of the pads 24 on the first surface 14 of the substrate 12. In the illustrated embodiment, a first end of a conductive wire 32 is coupled to the pad 30 of the image sensor 18 and a second end of the conductive wire 32 is coupled to the pad 24 of the substrate 12 to provide the electrical communication. It is to be appreciated, that the image sensor 18 could be electrically coupled to the substrate 12 through vias and solder balls, or any other conductive connectors, formed on the second surface of the image sensor 18 as is well known in the art.

A molded body 34 is located on the first surface 14 of the substrate 12 outward and spaced apart from the image sensor 18 and the conductive wires 32. In the illustrated embodiment, the molded body 34 is located over the surface mount devices 20. By placing the molded body 34 over the surface mount devices 20, the size of the camera module assembly 10 may be reduced in comparison to other camera module assemblies. That is, the area of the first surface 14 of the substrate 12 may be smaller than previous substrates. It is to be appreciated, however, that in other embodiments the molded body 34 may be located outward of the surface mount devices 20.

The molded body 34 includes an inner surface 36 proximate the image sensor 18 and an outer surface 38. The outer surface 38 of the molded body 34 forms an outer surface of camera module assembly 10. The molded body 34 has a stepped upper surface that includes a first upper surface 40 and a second upper surface 42. The first upper surface 40 is located outward of the second upper surface 42. The second upper surface 42 is proximate the image sensor 18 and the first upper surface 40 is raised a distance from the second upper surface 42. In that regard, the second upper surface 42 is closer to the first surface 14 of the substrate 12 than the first supper surface 40. In the illustrated embodiment, the molded body 34 further includes a raised portion 44 at the perimeter of the molded body 34. The raised portion 44 is raised relative to the first upper surface 40 and the second upper surface 42. A first recess 46 is located in the first upper surface 40 and a second recess 48 is located in the second upper surface 42 of the molded body 34.

The molded body 34 is made from an insulative molding material, such as molding resin. In many embodiments, the molded body 34 is made of a material that limits the amount of radiation that is transmitted therethrough. In one embodiment, the molded body 34 may be a high-density mold resin.

A transparent material 50 is secured to the molded body 34 over the second recess 48. The transparent material 50 may be any number of transparent materials configured to allow radiation within a desired frequency range to pass therethrough. In one embodiment, the transparent material 50 is glass. The transparent material 50 may be coated with various materials to obtain various effects. For instance, in some embodiments the transparent material 50 is coated with an anti-reflective material and/or an infrared (IR) coating.

A first surface of the transparent material 50 is secured to the molded body 34 with an adhesive material 54 located in the second recess 48. The adhesive material 54 may be any material that causes the transparent material 50 to be secured to the molded body 34 including those listed above. In one embodiment, the adhesive material 54 is UV curable. In that regard, the adhesive material 54 is a flowable material and upon UV curing, the adhesive material 54 hardens and secures the transparent material 50 to the molded body 34 at the second recess 48. It is to be appreciated that some of the adhesive material 54 may travel up a side surface of the transparent material 50 to provide a stronger adhesive bond. In some embodiments, the second recess 48 prevents the adhesive material 54 from flowing inwardly across the first surface of the transparent material 50 toward the image sensor 18, which could interfere with the light receiving path and thus affect the performance and reliability of the image sensor 18.

A lens assembly 58 is secured to the molded body 34 over the first recess 46. The lens assembly 58 typically includes at least one lens element and a mold that holds the lens element. The lens assembly 58 may further include a barrier layer for protecting the lens elements therein. In some embodiments, the lens assembly 58 may further include an actuator for auto focusing the lens elements.

The lens assembly 58 is secured to the molded body 34 with an adhesive material 60 located in the first recess 46. The adhesive material 60 in the first recess may be the same or different from the adhesive material 54 in the second recess 48. The adhesive material 60 may any adhesive that causes the lens assembly 58 to be secured to the molded body 34, such as those discussed above. In one embodiment, the adhesive material 60 is a curable adhesive, such as a thermally curable adhesive. In some embodiments, the adhesive material 60 may travel up an outer surface of the lens assembly 58 to provide a stronger adhesive bond. In some embodiments, the first recess 46 prevents the adhesive material 60 from flowing inwardly.

As will be discussed in more detail below, the raised portion 44 of the molded body 34 may be used during assembly for aligning the lens assembly 58 with the image sensor 18. Although not illustrated, it is to be appreciated that in other embodiments, the first and second surfaces 40, 42 of the molded body 34 are located in the same plane and thus the first and second recesses 46, 48 are located in the same plane.

The transparent material 50, the molded body 34 and the substrate 12 together form a first cavity 62. As shown in FIG. 1, the image sensor 18 is located in the first cavity 62. The lens assembly 58, the transparent material 50 and the molded body 34 form a second cavity 64. In some embodiments, the first cavity 62 is sealed from the second cavity 64. The second cavity 64 may include an air vent for venting excessive air generated during the UV curing process. Failure to release excessive air in the second cavity 64 can cause the lens element in the lens assembly 58 to tilt. By separating the first cavity 62 from the second cavity 64, the image sensor 18 can be protected from foreign objects that enter into the camera module assembly 10 through the air vent, thereby improving the reliability of the camera module assembly 10.

Generally described, in operation the image sensor 18 receives light that travels through the lens assembly 58 and the transparent material 50. The image sensor 18 may be configured to convert the received light into electrical signals. The electrical signals are provided outside of the camera module assembly 10 through the lands 26 on the second surface 16 of the substrate 12.

Figure 2A:
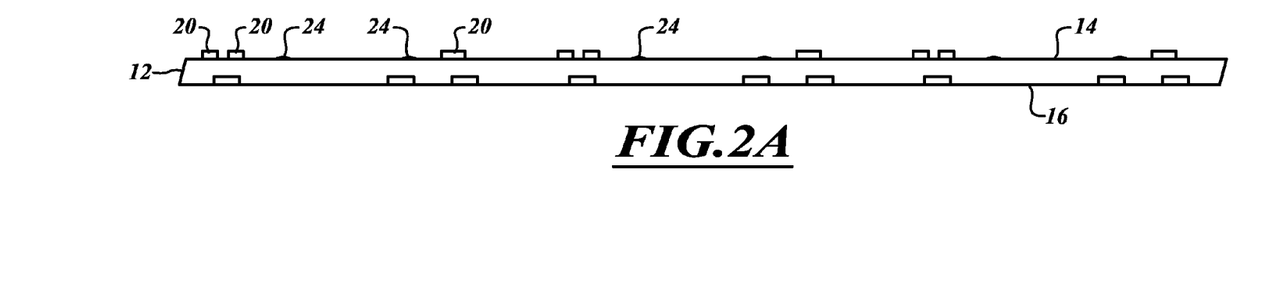
FIGS. 2A-2G are cross-section views of various steps for making the camera module assembly of FIG. 1.

FIGS. 2A-2G illustrate a method of making a plurality of camera module assemblies, such as the camera module assembly 10 of FIG. 1, according to one embodiment. As shown in FIG. 2A, the method may include securing surface mount devices 20 to a first surface 14 of a substrate 12. In one embodiment, the method may also include forming the substrate as is well known in the art and is not shown herein in the interest of brevity.

Figure 2B:
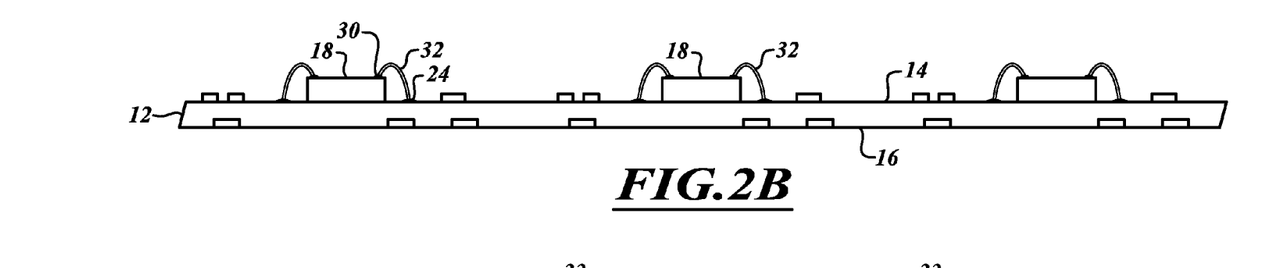

As shown in FIG. 2B, image sensors 18 are secured to the first surface 14 of the substrate 12 at spaced apart distances. Each of the image sensors 18 are electrically coupled to the first surface 14 of the substrate 12. As shown in FIG. 2B, a first end of a conductive wire 32 is secured to a pad 30 of the image sensor 18 and a second end of the conductive wire 32 is secured to a pad 24 of the substrate 12. Although only two conductive wires are shown for each image sensor 18, more or less conductive wires may be used to electrically connect each image sensor 18 to the substrate 12. As mentioned above, in another embodiment, the image sensor 18 is connected to the first surface 14 of the substrate 12 by conductive through vias that extend through the image sensor 18 and by solder balls that are located between the image sensor 18 and the substrate 12 as is well known in the art.

Figure 2C:
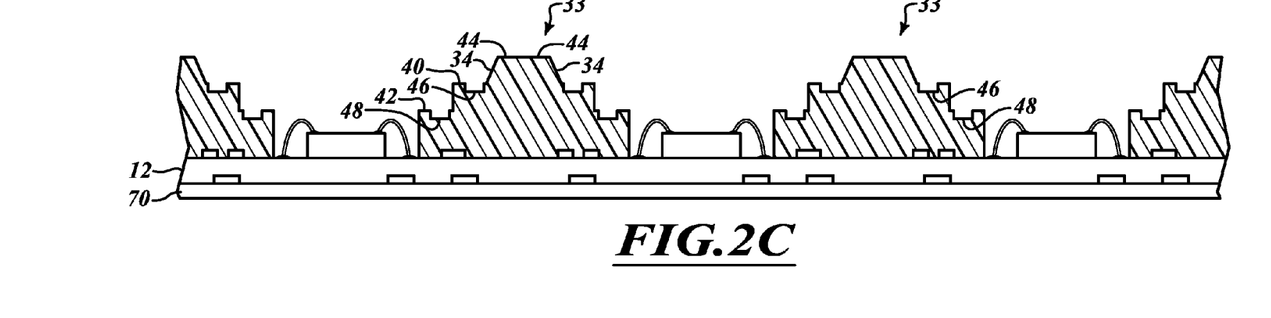

As shown in FIG. 2C, a molded feature 33 is formed on the first surface 14 of the substrate 12 between the image sensors 18. Each molded feature 33 includes two adjacent molded bodies 34 described above. That is, each molded feature 33 includes the two attached raised portions 44, a first surface 40 with a first recess 46 on each side of the raised portions 44, and a second surface 42 with a second recess 48 proximate each of the first surfaces 40. In the illustrated embodiment, the molded feature 33 is formed over the surface mount devices 20. The molded feature 33 may be formed by placing the substrate 12 into a mold and injecting resin into the mold as is well known in the art.

As shown in FIG. 2C, in some embodiments, a second surface 16 of the substrate 12 is secured to a support structure 70, such as mounting tape. The support structure 70 may be used to provide further support during subsequent processing. It is to be appreciated that in other embodiments the substrate 12 itself may provide suitable support for the subsequent processing and thus the support structure 70 is not provided.

Figure 2D:
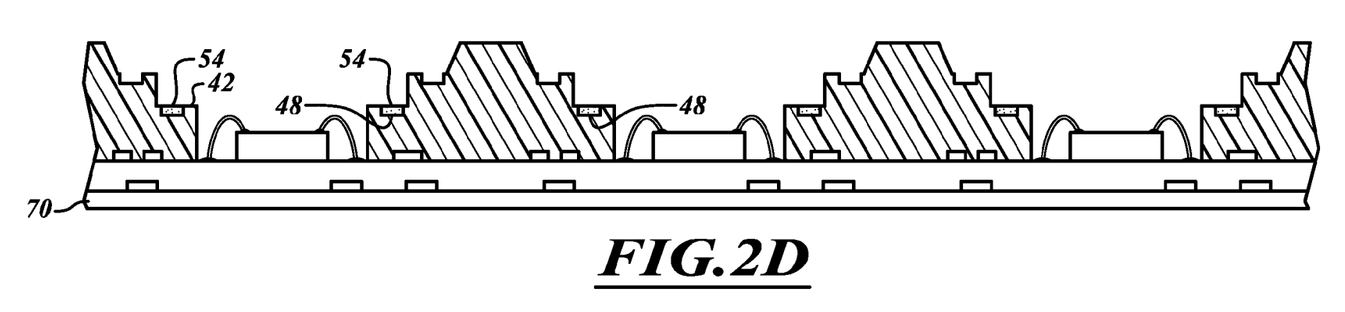
Figure 2E:
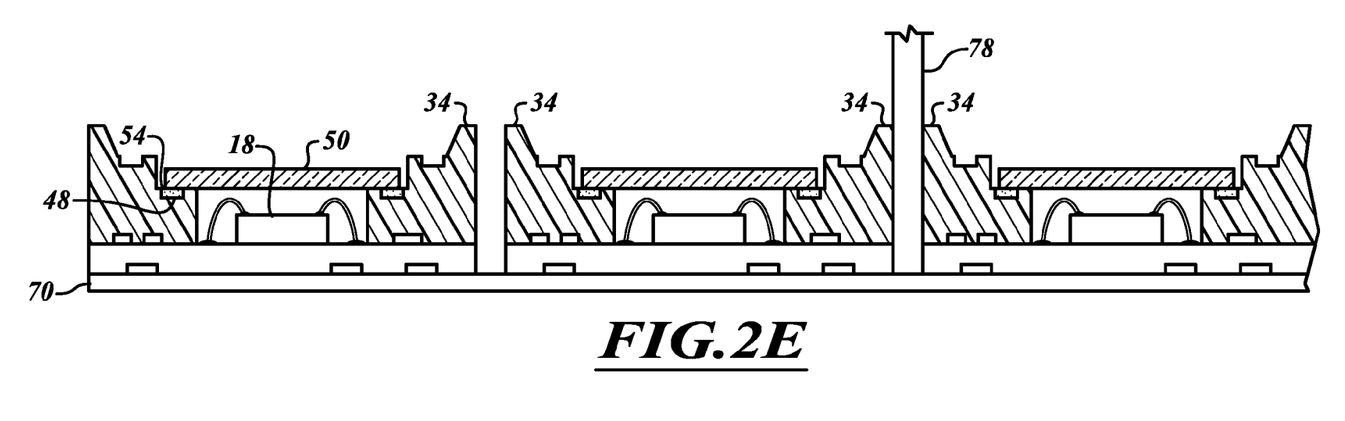

FIG. 2D illustrates that an adhesive material 54 is placed into or dispensed into the second recess 48. As shown in FIG. 2E, a transparent material 50 is placed over the image sensor 18 and in contact with a portion of the second surface 42 and adhesive material 54 in the second recess 48. In the embodiment in which the adhesive material 54 is curable adhesive, the adhesive material 54 is exposed to UV radiation to cause the adhesive material 54 to harden so that transparent material 50 adheres to the second surface 42 and the second recess 48. As mentioned above, some of the adhesive material 54 may flow up the side surface of the transparent material 50 to provide improved adhesion. The raised portion of the first surface 40 relative to the second surface 42 allows for ease of aligning of the transparent material 50 over the image sensor 18.

As further shown in FIG. 2E, each of the assemblies may be separated into individual assemblies, such as by dicing using a saw blade or a laser through the molded feature 33 to form molded bodies 34. As shown in FIG. 2E, a saw blade 78 may separate the individual assemblies without cutting through the support structure. In some embodiments, the individual assemblies may then be placed on a carrier (not shown) for further processing.

Figure 2F:
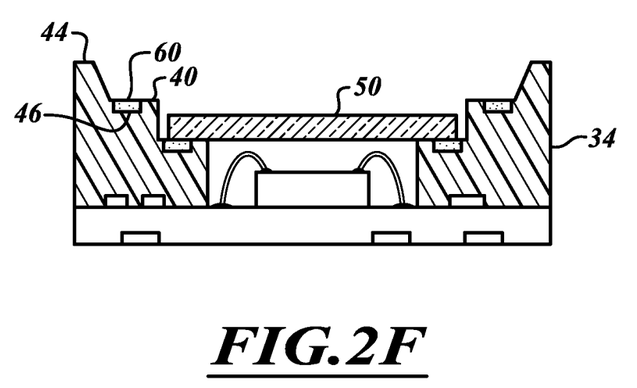
Figure 2G:
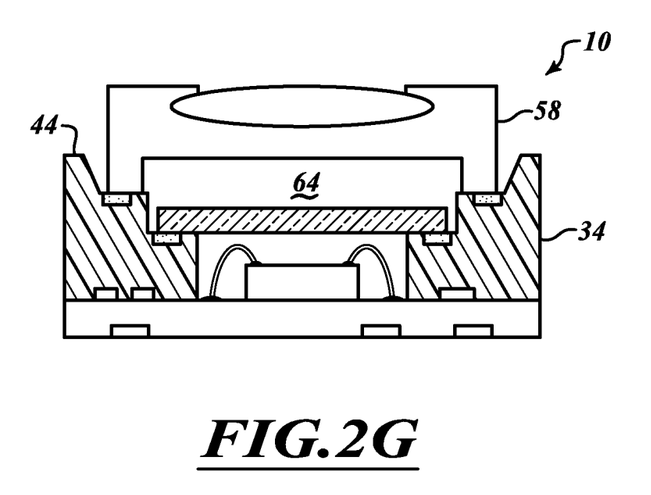

FIGS. 2F and 2G illustrate a method for attaching the lens assembly 58 to the molded body 34 to form the image module assembly 10 according to one embodiment. As shown in FIG. 2F, an adhesive material 60 is placed into or dispensed into the first recess 46 of the first surface 40 of the molded body 34. Then, the lens assembly 58 is placed onto the adhesive material 60 over the first recess 46. As indicated above, the adhesive material 60 in the first recess 46 may be any glue, tape, or adhesive material capable of securing the lens assembly 58 to the molded body 34. In one embodiment, the adhesive material 60 is used to secure the lens assembly 58 to the molded body 34 is thermally curable. In that regard, the camera module assembly 10 may be then heated to cure the adhesive material 60.

It is to be appreciated that the adhesive material 60 in the first recess 46 may be the same as or different from the adhesive material 54 in the second recess 48. As indicated above, the thermal curing of the adhesive material 60 can cause excessive air pressure in the second cavity 64. In many embodiments, the lens assembly 58 includes an air vent for venting the excessive air to prevent tilting of one or more lens elements in the lens assembly 58. Additionally, some of the adhesive material 60 may travel up the outer surface of the lens assembly 58 thereby improving adhesion therebetween.

It is to be appreciated that the raised portion 44 of the molded body 34 provides an alignment feature for aligning the lens assembly 58 with the image sensor 18. That is, the sloped inner surface of the raised portion 44 may assist in guiding the installation of the lens assembly 58 onto the first surface 40 of the molded body 34. In some cases, the speed at which the lens assembly 58 is aligned with the image sensor 18 may be improved and may not require expensive aligning tools.

Figure 3A:
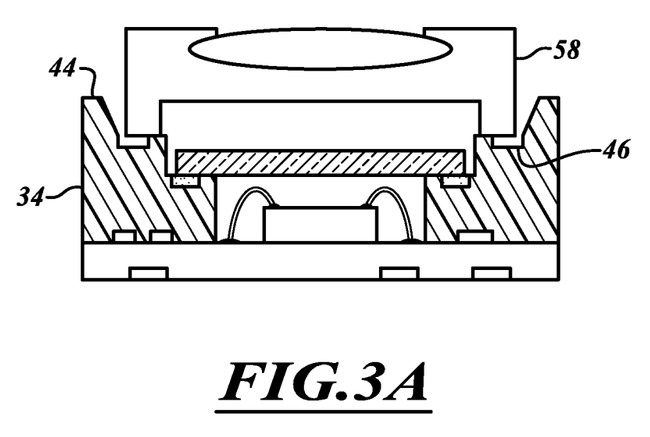
FIGS. 3A and 3B illustrate alternative steps for securing the lens assembly to the molded body according to another embodiment.
Figure 3B:
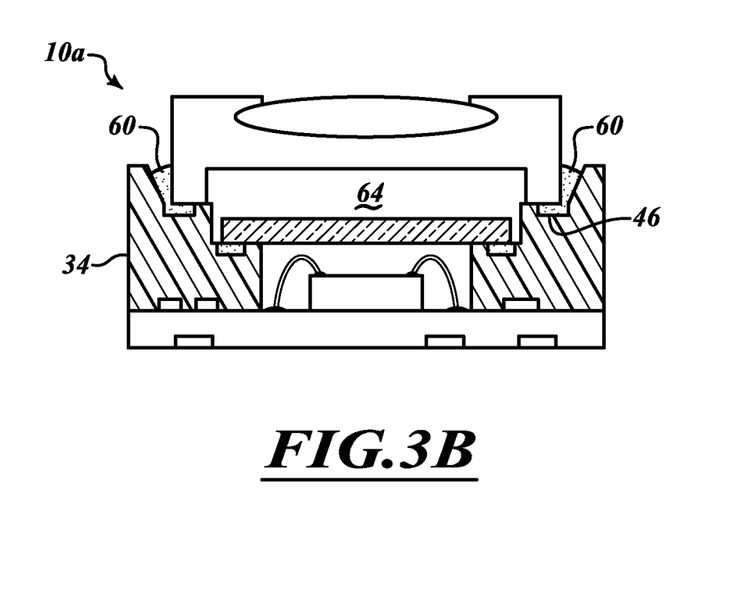

FIGS. 3A and 3B illustrate another method for attaching the lens assembly 58 to the molded body 34 according to another embodiment. As shown in FIGS. 3A and 3B, the lens assembly 58 of the camera module assembly 10a is placed onto the molded body 34 and over the first recess 46 and the adhesive material 60 is then placed into the first recess 46. As shown in FIG. 3B, the adhesive material 60 may also be dispensed along the outer surface of the lens assembly 58. In that regard, the adhesive material 60 adheres to more surface area of the lens assembly 58 and the molded body 34 and in some embodiments, thereby improving the adhesion therebetween.

Figure 4:
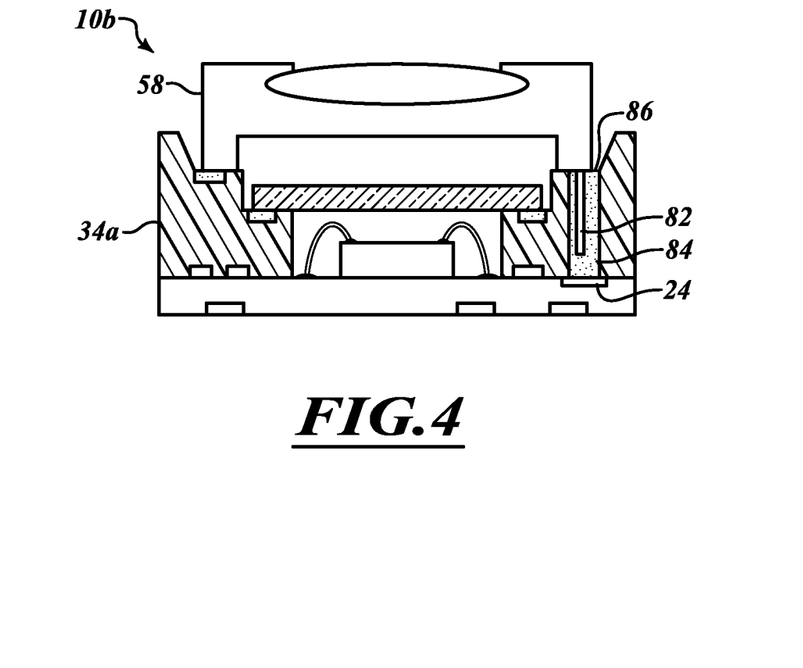
FIG. 4 is a cross-section view of a camera module assembly in which the lens assembly is an automatic focus lens assembly according to one embodiment.

FIG. 4 illustrates a camera module assembly 10b according to another embodiment. The camera module assembly 10b of FIG. 4 is the same as the camera module assembly 10 of FIG. 1, except that the camera module assembly 10b of FIG. 4 includes automatic lens focus capabilities. The molded body 34a is substantially the same as the molded body 34 of FIG. 1 except that the molded body 34a includes two through holes 84, with one through hole 84 being shown. Additionally, the camera module assembly 10b includes conductive pins 82 that are coupled to a driving mechanism (not shown) in the lens assembly 58. Each of the conductive pins 82 extends from a surface of the lens assembly 58 and is provided through a respective one of the through holes 84 in the molded body 34a. Each through hole 84 is aligned with a contact pad 24 on the first surface 14 of the substrate 12. In the illustrated embodiment, the through hole 84 is filled with conductive glue 86 to provide electrical communication between the conductive pin 82 and the contact pad 24. It is to be appreciated that other methods and structures may be used to provide electrical communication therebetween, such as by using a conductive pin that includes a spring feature.

Figure 5:
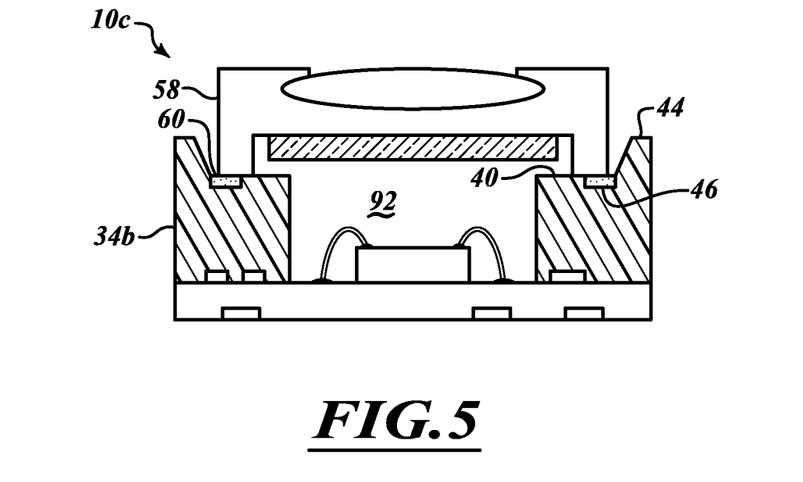
FIG. 5 is a cross-section view of another camera module assembly according to another embodiment.

FIG. 5 illustrates a camera module assembly 10c according to another embodiment. The camera module assembly 10c of FIG. 5 is the same as the camera module assembly 10 of FIG. 1, except for a few differences that will be discussed below. In particular, the transparent material 50 of the camera module assembly 10c of FIG. 5 is attached to a surface of the lens assembly 58. Additionally, the molded body 34b has only a first surface 40 and a first recess 46 and does not include the second surface 42 and the second recess 48. A single cavity 92 is formed as is shown in FIG. 5.

The camera module assembly 10c may be formed by first securing the transparent material 50 to the surface of the lens assembly 58 using an adhesive material (not shown) provided therebetween. In one embodiment, transparent material 50 may be secured by placing the adhesive material between the lens assembly 58 and the transparent material 50 at a perimeter of the transparent material 50. Then the lens assembly 58 is secured to the mold assembly 34b, such as by dispensing adhesive material in the first recess 46 and then placing the lens assembly 50 over the first recess 46 as discussed in reference to FIGS. 2F and 2G or by placing the lens assembly 50 over the first recess 46 and then dispensing the adhesive material 60 in the first recess 46 as discussed in reference to FIGS. 3A and 3B.

Figure 6:
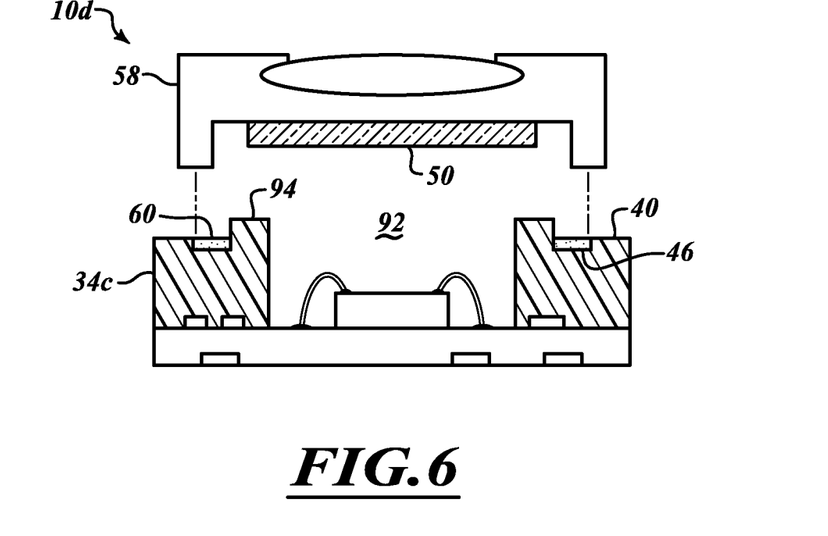
FIG. 6 is a cross-section view of another camera module assembly according to yet another embodiment.

FIG. 6 illustrates a camera module assembly 10d according to another embodiment. The camera module assembly 10d of FIG. 6 is the same as the camera module assembly 10c of FIG. 5, except that an inner raised portion 94 of the molded assembly 34c in the camera module assembly 10d of FIG. 6 is located proximate an inner surface of the molded assembly 34c rather than the outer surface as shown in FIG. 5. It is to be appreciated that the inner raised portion 94 assists with aligning the lens assembly 58 to the molded body 34c.

Figure 7:
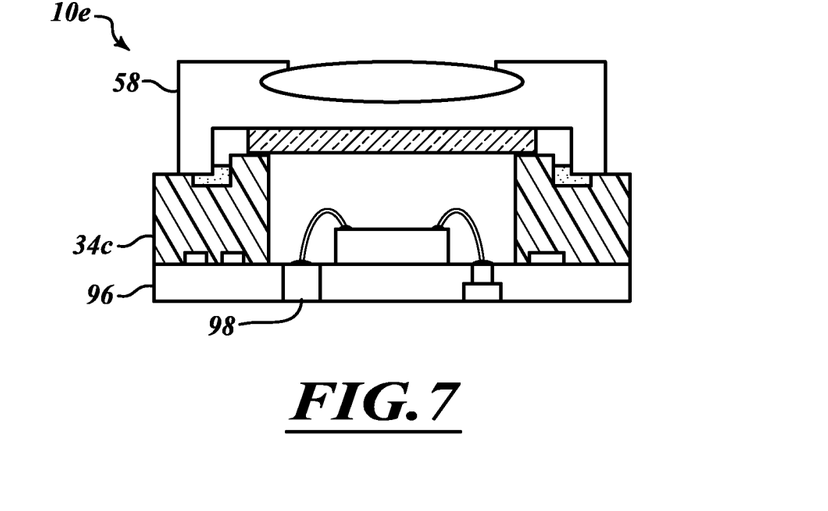
FIG. 7 is a cross-section view of another camera module assembly according to yet another embodiment.

FIG. 7 illustrates a camera module assembly 10e according to another embodiment. The camera module assembly 10e of FIG. 7 is the same as the camera module assembly 10c of FIG. 5, except that rather than having a substrate the camera module assembly 10e of FIG. 7 has a leadframe 98. Although the camera module assembly 10e only shows leads of the leadframe 98, it is to be appreciated that the leadframe 98 may also include a die pad. The leadframe is surrounded by molding material 96, such as molding resin, which, in some embodiments, is the same material and may be formed at the same time as the molded body 34c. In the illustrated embodiment, the molding material is formed at a different time than the molded body so that the surface mount devices may also be added.

Figure 8:
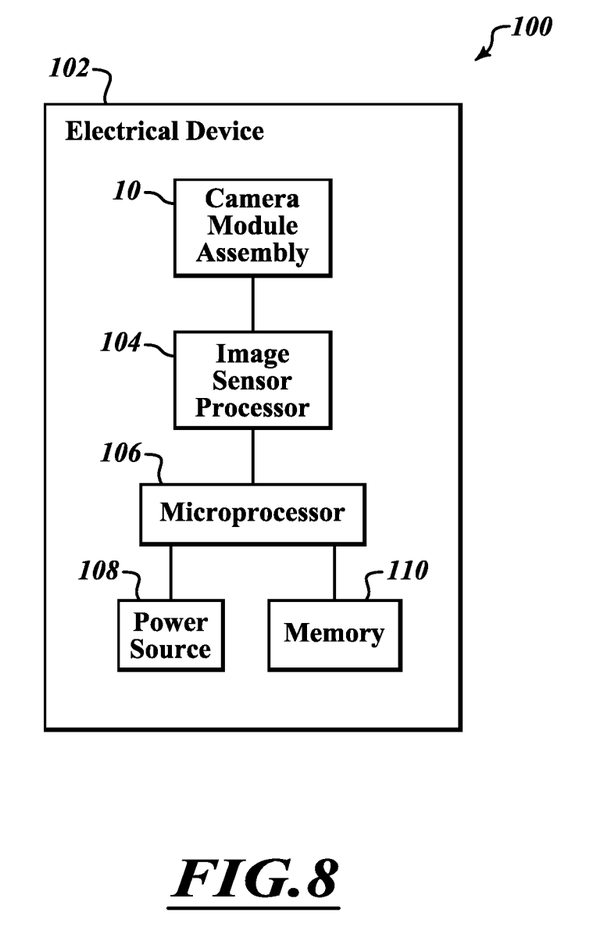
FIG. 8 illustrates a block diagram of an electronic device that includes a camera module assembly.

FIG. 8 illustrates a block diagram 100 of an electronic device 102 that includes a camera module assembly 10, such as any of the camera module assemblies disclosed herein, coupled to image sensor processor 104. The image sensor processor 104 may be any processor configured to send and receive signals from the camera module assembly 10. The electronic device 102 may further include a power source 108 to provide electric power for the device. The power source 108, which may be a battery, may be coupled to the microprocessor 106. The electric device 102 may also include a memory 110 coupled to or incorporated in the microprocessor 106. The electronic device 102 may be any electronic device including but not limited to a cellphone, a smartphone, a camera, a video camera, a tablet, and wearable computing, that may be located in clothing, glasses, shoes, watches or any other wearable device.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A camera module assembly comprising:
    a substrate having a first surface and a pad formed on the first surface;
    an optical device secured to the first surface of the substrate, the optical device having a pad;
    a conductive wire having a first end coupled to the pad of the substrate and a second end coupled to the pad of the optical device;
    a molded body on the first surface of the substrate, the molded body having a through opening in a central portion of the molded body that defines an inner surface of the molded body, the optical device located in the through opening, a first surface of the molded body including a first recess that is spaced apart from the inner surface;
    an adhesive material in the first recess; and
    a lens assembly secured to the first surface of the molded body over the first recess by the adhesive material.

2. The camera module assembly of claim 1, wherein the first surface of the molded body includes a second recess.

3. The camera module assembly of claim 2, wherein the first recess is located a first distance from the first surface of the substrate and the second recess is located a second distance from the first surface of the substrate, the second distance being shorter than the first distance.

4. The camera module assembly of claim 2, further comprising a transparent material located over the second recess and secured to the molded body by an adhesive material.

5. The camera module assembly of claim 4, wherein the adhesive material used to secure the transparent material to the molded body is a UV curable glue.

6. The camera module assembly of claim 1, further comprising a transparent material that is secured to a surface of the optical lens assembly, the transparent material being proximate the optical device.

7. The camera module assembly of claim 1, wherein the molded body includes a raised portion proximate the first recess.

8. The camera module assembly of claim 7, wherein the raised portion is configured to prevent the adhesive material from flowing along a side surface of the molded body, the side surface of the molded body being an external surface of the optical package.

9. A method of forming a camera module assembly, the method comprising:
    forming a molded body on a surface of a substrate, the molded body having a surface that includes a first recess and a second recess;
    securing an optical device to the surface of the substrate;
    electrically coupling a pad of the optical device to a pad of the substrate;
    securing a transparent material to the molded body with an adhesive material that is dispensed in the first recess; and
    securing an optical lens assembly to the molded body with an adhesive material that is dispensed in the second recess.

10. The method of claim 9 wherein securing the transparent material comprises dispensing the adhesive material into the first recess of the molded body and then placing the transparent material over the first recess and in contact with the adhesive material that is in the first recess.

11. The method of claim 10 further comprising curing the adhesive material.

12. The method of claim 9 wherein electrically coupling comprises coupling a first end of a conductive wire to the pad of the optical device and coupling a second end of the conductive wire to the pad of the substrate.

13. The method of claim 9 wherein the adhesive material dispensed in the first recess is different from the adhesive material dispensed in the second recess.

14. The method of claim 9 wherein securing the optical device to the surface of the substrate comprises dispensing the adhesive material in the second recess and then placing the optical device over the second recess and in contact with the adhesive in the second recess.

15. The method of claim 9 wherein securing the optical device to the surface of the substrate comprises placing the optical device over a portion of the second recess and then dispensing the adhesive material into the second recess and in contact with the optical device.

16. The method of claim 15 wherein dispensing the adhesive material further comprises dispensing the adhesive material along a side surface of the optical device.

17. The method of claim 9 wherein securing the optical lens assembly to the molded body further comprises coupling an electrical pin of the optical lens assembly with a pad of the substrate.

18. A method of forming a camera module assembly, the method comprising:
    forming a molded body on a surface of a substrate, the molded body having an inner surface delimiting a through opening and an upper surface that includes a recess spaced apart from the inner surface;
    securing an optical device and the molded body to the surface of the substrate, the optical device being located in the through opening of the molded body;
    electrically coupling a pad of the optical device to a pad of the substrate;
    securing an optical lens assembly to the molded body using an adhesive material that is dispensed in the recess.

19. The method of claim 18 wherein securing the optical lens assembly to the molded body comprises placing the optical lens assembly over a portion of the recess and dispensing the adhesive material in the recess between the optical lens assembly and the molded body.

20. The method of claim 18 wherein the recess is a first recess, the surface of the molded body further including a second recess, the method further comprising securing a transparent material to the molded body using an adhesive material that is dispensed in the first recess, the transparent material being located between the substrate and the optical lens assembly.

21. An electronic device comprising:
    a microprocessor; and
    a camera module assembly, the camera module assembly including:
        a substrate having a first surface and a pad formed on the first surface;
        an optical device secured to the first surface of the substrate, the optical device having a pad;
        a conductive connector coupled to the pad of the substrate and to the pad of the optical device;
        a molded body on the first surface of the substrate outward of the optical device, the molded body including a first recess and a second recess;
        adhesive material in the first recess and in the second recess;
        a lens assembly secured to the molded body over the first recess by the adhesive material in the first recess; and
        a transparent material secured to the molded body over the second recess by the adhesive material in the second recess.

22. The electronic device of claim 21 wherein the electronic device is at least one of a cellphone, a smartphone, a camera, video camera, a tablet, and wearable computing.

* * * * *